United States Patent
Uchiyama et al.

(10) Patent No.: US 9,993,841 B2
(45) Date of Patent: Jun. 12, 2018

(54) PARTICULATE FILM LAMINATING SYSTEM AND PARTICULATE FILM LAMINATING METHOD USING SAME

(71) Applicant: KABUSHIKI KAISHA ATSUMITEC, Shizuoka (JP)

(72) Inventors: Naoki Uchiyama, Shizuoka (JP); Tomomi Kanai, Shizuoka (JP)

(73) Assignee: KABUSHIKI KAISHA ATSUMITEC, Shizuoka (JP)

( * ) Notice: Subject to any disclaimer, the term of this patent is extended or adjusted under 35 U.S.C. 154(b) by 257 days.

(21) Appl. No.: 14/383,042

(22) PCT Filed: Jan. 31, 2013

(86) PCT No.: PCT/JP2013/052196
§ 371 (c)(1),
(2) Date: Sep. 4, 2014

(87) PCT Pub. No.: WO2013/145847
PCT Pub. Date: Oct. 3, 2013

(65) Prior Publication Data
US 2015/0030765 A1    Jan. 29, 2015

(30) Foreign Application Priority Data
Mar. 26, 2012  (JP) ................................. 2012-069775

(51) Int. Cl.
*B05D 1/12*    (2006.01)
*B05D 1/36*    (2006.01)
(Continued)

(52) U.S. Cl.
CPC .................. *B05D 1/12* (2013.01); *B05D 1/36* (2013.01); *C23C 14/228* (2013.01); *C23C 14/24* (2013.01);
(Continued)

(58) Field of Classification Search
None
See application file for complete search history.

(56) References Cited

U.S. PATENT DOCUMENTS 5,759,634 A    6/1998  Zang
6,153,259 A    11/2000 Honda et al.

FOREIGN PATENT DOCUMENTS

JP    2000-297361 A    10/2000
JP    2003321765 A     11/2003
WO    2006/019144 A1    2/2006

OTHER PUBLICATIONS

Machine translation of JP 2000-297361.*
(Continued)

*Primary Examiner* — Shamim Ahmed
*Assistant Examiner* — Bradford M Gates
(74) *Attorney, Agent, or Firm* — Kinney & Lange, P.A.

(57) ABSTRACT

A particulate film laminating system includes: a nanoparticle generating chamber in which nanoparticles of a metal material are generated; a nanofiber generating chamber in which nanofibers of a resin material are generated; a laminating chamber in which the nanoparticles and the nanofibers are film-formed and laminated on a substrate; a nanoparticle film-forming region configured such that the nanoparticles are film-formed in the laminating chamber; a nanofiber film-forming region configured such that the nanofibers are film-formed in the laminating chamber; a moving unit which moves the substrate between the nanoparticle film-forming region and the nanofiber film-forming region; an exhaust unit which exhausts the laminating chamber; and a coolant-gas introduction unit which introduces coolant gas into each of the nanoparticle generating chamber and the nanofiber generating chamber.

5 Claims, 4 Drawing Sheets

(51) Int. Cl.
| | |
|---|---|
| *C23C 14/24* | (2006.01) |
| *C23C 14/28* | (2006.01) |
| *C23C 14/56* | (2006.01) |
| *C23C 14/22* | (2006.01) |

(52) U.S. Cl.
CPC .............. *C23C 14/28* (2013.01); *C23C 14/56* (2013.01); *C23C 14/562* (2013.01)

(56) References Cited

OTHER PUBLICATIONS

European Search Report dated Aug. 10, 2015, for corresponding European Patent Application No. 13767270.5.
Halpern B L et al., "Jet Vapor Deposition of Single and Multicomponent Tin Films", Metal Finishing, Elsevier, vol. 90, No. 12, Dec. 1, 1992.
International Search Report dated Feb. 27, 2013, for PCT/JP2013/052196.
European Office Action dated Jun. 3, 2017, for corresponding European Application No. 13767270.5.
Halpern B L et al., "Je Vapor Deposition of Single and Multicomponent Thin Films", Metal Finishing, Elsevier, Vo., 90, No. 12, Dec. 1, 1992, pp. 37-41.

\* cited by examiner

PARTICULATE FILM LAMINATING SYSTEM AND PARTICULATE FILM LAMINATING METHOD USING SAME

TECHNICAL FIELD

The present invention relates to a particulate film laminating system and a particulate film laminating method using the particulate film laminating system.

BACKGROUND ART

An ultrafine particle film forming method and an ultrafine particle film forming system are described in Patent Document 1. This system is configured such that an ultrafine particle film is formed on a substrate by generating vapor atoms from a material and moving the vapor atoms through a carrying pipe together with inert gas. In other words, the configuration of such particle film forming system and method are expressed in general as follows: Upper and lower chambers are installed so as to communicate with each other by a narrow pipe. Then, the upper chamber is vacuumed, and coolant gas is made to flow into the lower chamber. Then, the vapor atoms evaporated from the metal material are cooled and moved into the upper chamber by the pressure difference between the upper and lower chambers. Then, the vapor atoms are collected, in a state of particles, on the substrate arranged in the upper chamber. The coolant gas is, for example, helium gas or argon gas and is made to flow so as to prevent aggregation and grain growth of the particles during the movement.

However, such a conventional particle film forming system has only been capable of depositing particles on the substrate. Therefore, for example, in the case where a hydrogen sensor is formed by using, as particles, Mg, a Mg—Ni alloy, or the like, which absorbs and stores hydrogen, the diffusion property of hydrogen (permeability of gas) becomes poor, so that the nylon-based resin is lowered. Further, in the case where such conventional particle film forming system is used for metal nanoparticles, when the metal nanoparticles are deposited on the substrate, the metal nanoparticles re-aggregate, so that the fine nanoparticle state of the metal nanoparticles cannot be maintained.

PRIOR ART DOCUMENT

Patent Document

Patent Document 1: Japanese Patent Application Laid-Open Publication No. 2000-297361

SUMMARY OF THE INVENTION

Problems to be Solved by the Invention

The present invention has been made in view of the above-described prior art techniques. An object of the invention is to provide a particulate film laminating system and a particulate film laminating method using the particulate film laminating system which is capable of, in the case where nanoparticles are generated by evaporating a hydrogen storage alloy, improving the diffusion property of hydrogen and preventing re-aggregation of the nanoparticles collected on a substrate.

Means for Solving the Problems

In order to achieve the above-described object, the present invention is to provide a particulate film laminating system which is featured by including: a nanoparticle generating chamber in which a metal material to be heated is arranged and nanoparticles of the metal material are generated; a nanostructure generating chamber in which a resin material to be heated is arranged and nanostructures of the resin material are generated; a laminating chamber which is connected to the nanoparticle generating chamber and the nanostructure generating chamber respectively via a particle communication pipe and a structure body communication pipe so as to enable the nanoparticles and the nanostructures to be film-formed and laminated on a substrate; a nanoparticle film-forming region configured such that the nanoparticles are film-formed in the laminating chamber; a nanostructure film-forming region configured such that the nanostructures are film-formed in the laminating chamber; a moving unit which moves the substrate between the nanoparticle film-forming region and the nanostructure film-forming region; an exhaust unit which exhausts the laminating chamber; and a coolant-gas introduction unit which introduces coolant gas into each of the nanoparticle generating chamber and the nanostructure generating chamber.

It is preferred that a nanoparticle film-forming unit is formed by the nanoparticle generating chamber, the particle communication pipe, and the nanoparticle film-forming region, and that a plurality of the nanoparticle film-forming units are provided.

It is preferred that the moving unit is formed by a pair of rolls each arranged in each of the nanoparticle film-forming region and the nanostructure film-forming region, and that the substrate which is endless is wound around the pair of rolls.

Further, the present invention is to provide a particulate film laminating method which is featured by including: a nanostructure generating process of generating the nanostructures by heating and evaporating the resin material in the nanostructure generating chamber; a nanostructure film-forming process in which a pressure difference is provided between the laminating chamber and the nanostructure generating chamber by exhausting the laminating chamber by the exhaust unit, and the nanostructures are introduced into the nanostructure film-forming region by the pressure difference through the structure body communication pipe, and a nanostructure film is formed by film-forming the nanostructures on the substrate arranged in the nanostructure film-forming region; a going process of moving the substrate with the nanostructures film-formed thereon into the nanoparticle film-forming region by the moving unit; a nanoparticle generating process of generating the nanoparticles by heating and evaporating the metal material in the nanoparticle generating chamber; a nanoparticle film-forming process in which a pressure difference is provided between the laminating chamber and the nanoparticle generating chamber by exhausting the laminating chamber by the exhaust unit, and the nanoparticles are introduced into the nanoparticle film-forming region by the pressure difference through the particle communication pipe, and a nanoparticle film is formed by film-forming the nanoparticles on the nanostructures film-formed on the substrate arranged in the nanoparticle film-forming region; and a returning process of moving the substrate with both of the nanoparticle film and the nanostructure film formed thereon into the nanostructure film-forming region by the moving unit.

ADVANTAGEOUS EFFECTS OF THE INVENTION

According to the present invention, it is possible to perform a film-forming process in which the nanostructures are film-formed on the substrate in the nanostructure film-forming region, in which the substrate is moved into the nanoparticle film-forming region by the moving unit, and then nanoparticles are film-formed on the film-formed nanostructures, and in which the substrate is again moved into the nanostructure film-forming region by the moving unit, and then the nanostructures are film-formed on the film-formed nanoparticles. By repeating this process, the film-formed nanoparticles can be held between the film-formed nanostructures. Thereby, the nanoparticles are film-formed so as to be arrayed in layers. Therefore, in the case where the nanoparticles are generated from a hydrogen storage alloy, the diffusion property of hydrogen is improved by using, as a hydrogen sensor, a laminated body obtained by laminating the film-formed nanoparticles.

Further, in the laminated body in which the nanoparticle film is held between the nanostructure films, the nanoparticles stably remain in the nanoparticle state, and hence the occurrence of grain growth is prevented.

Further, when the moving unit is formed by a pair of rolls respectively provided in the nanoparticle film-forming region and the nanostructure film-forming region, and when the substrate which is endless is wound around the pair of rolls, the nanoparticles and the nanostructures can be continuously film-formed, and hence the working efficiency is improved.

MODE FOR CARRYING OUT THE INVENTION

Figure 1:
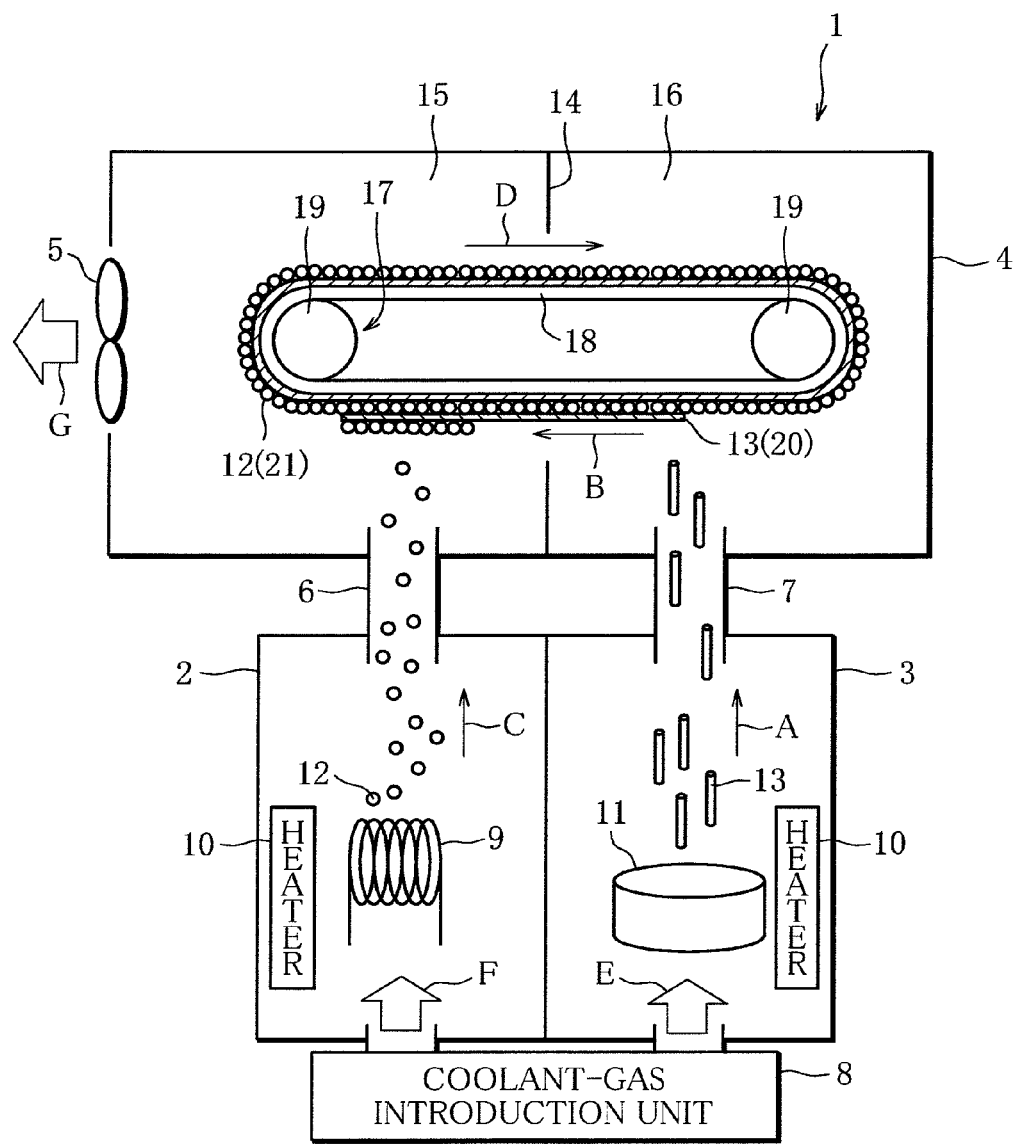
FIG. 1 is a schematic view of a particulate film laminating system according to the present invention.

As shown in FIG. 1, a particulate film laminating system 1 according to the present invention includes a nanoparticle generating chamber 2, a nanofiber generating chamber 3, and a laminating chamber 4. An exhaust unit 5 is attached to the laminating chamber 4, and the laminating chamber 4 is vacuumed by the exhaust unit 5. The nanoparticle generating chamber 2 and the nanofiber generating chamber 3 are connected to the laminating chamber 4 respectively via a particle communication pipe 6 and a fiber communication pipe 7. As the particle communication pipe 6 and the fiber communication pipe 7, it is possible to use, for example, ⅛ pipe. A coolant-gas introduction unit 8, into which coolant gas is introduced, is attached to the nanoparticle generating chamber 2 and the nanofiber generating chamber 3. The nanoparticle generating chamber 2, the nanofiber generating chamber 3, and the laminating chamber 4 are hermetically sealed except the communication portions with the exhaust unit 5 and the coolant-gas introduction unit 8.

A metal material 9 is arranged in the nanoparticle generating chamber 2. As the metal material 9, it is possible to use, for example, a metal wire made of magnesium or nickel, or to use a metal wire made of an alloy of these metals. Further, a heater 10 is arranged in the nanoparticle generating chamber 2. The heater 10 is used for heating the metal material 9. A crucible, a plasma generator, or the like, can be used as the heater 10. The metal material 9 is evaporated by being heated by the heater 10, so that nanoparticles 12 are generated.

On the other hand, a resin material 11 is arranged in the nanofiber generating chamber 3. As the resin material 9, it is possible to use, for example, nylon-based resin, polyvinylpyrrolidone (PVP), polyethylene oxide (PEO), and the like. Further, the heater 10, which is the same as the heater 10 arranged in the nanoparticle generating chamber 2, is arranged in the nanofiber generating chamber 3. The resin material 11 is evaporated by being heated by the heater 10, so that nanofibers 13 are generated.

A partition wall 14 is formed in the laminating chamber 4, and the laminating chamber 4 is divided into a nanoparticle film-forming region 15 and a nanofiber film-forming region 16 by the partition wall 14. A moving unit 17 is arranged in the laminating chamber 4. By the moving unit 17, a substrate 18, on which the nanoparticles 12 and the nanofibers 13 are to be film-formed, is made to reciprocate between the nanoparticle film-forming region 15 and the nanofiber film-forming region 16. Specifically, the moving unit 17 is formed by a pair of rolls 19. Each of the rolls 19 is arranged in each of the nanoparticle film-forming region 15 and the nanofiber film-forming region 16. The substrate 18 which is endless is wound around the pair of rolls 19, so that, by the rotation of the rolls 19, the substrate 18 can be made to continuously reciprocate between the nanoparticle film-forming region 15 and the nanofiber film-forming region 16.

In the following, a procedure at the time when a particulate film is formed by using the particulate film laminating system 1 configured as described above will be described.

First, a nanostructure generating process is performed. This process is performed in the nanofiber generating chamber 3. Specifically, the resin material 11 is evaporated by being heated by the heater 10, so that the nanofibers 13 are generated. The nanofibers 13 are generated in a gas phase environment. At this time, coolant gas containing helium or argon is introduced into the nanofiber generating chamber 3 by the coolant-gas introduction unit 8 (as shown by arrow E in FIG. 1).

Next, a nanostructure film-forming process is performed. In this process, a nanofiber film 20 is formed by forming a film of the nanofibers 13 on the substrate 18 arranged in the nanofiber film-forming region 16 of the laminating chamber 4. Specifically, first, the nanofibers 13 generated in the nanostructure generating process are guided into the nanofiber film-forming region 16. To this end, the inside of the laminating chamber 4 is vacuumed by the exhaust unit 5 (as shown by arrow G of FIG. 1), so that a pressure difference is provided between the laminating chamber 4 and the nanofiber generating chamber 3. In both the chambers 4 and 3 connected to each other by the fiber communication pipe 7, an air flow from the nanofiber generating chamber 3 to the laminating chamber 4 is generated by the pressure difference (as shown by arrow A of FIG. 1). By this flow, the nanofibers 13 are guided from the nanofiber generating chamber 3 into the nanofiber film-forming region 16 of the laminating chamber 4 through the fiber communication pipe 7. Then, the nanofibers 13 are film-formed on the substrate 18 arranged in the nanofiber film-forming region 16.

A going process is performed simultaneously with the nanostructure film-forming process. The substrate 18 is made to reciprocate between the nanofiber film-forming region 16 and the nanoparticle film-forming region 15 by the moving unit 17, and hence the substrate 18 arranged in the nanofiber film-forming region 16 is moved into the nanoparticle film-forming region 15. That is, a process in which the substrate 18 is moved from the nanofiber film-forming region 16 into the nanoparticle film-forming region 15 (as shown by arrow B of FIG. 1) is the going process. During this movement, the nanofibers 13 are film-formed on the substrate 18, and hence the membrane-like nanofiber film 20 is formed on the substrate 18 while the substrate 18 is moved.

Then, a nanoparticle generating process is performed. This process is performed in the nanoparticle generating chamber 2. Specifically, the metal material 9 is evaporated by being heated by the heater 10, so that the nanoparticles 12 are generated. The nanoparticles 12 are generated in a gas phase environment. At this time, coolant gas containing helium or argon is introduced into the nanoparticle generating chamber 2 by the coolant-gas introduction unit 8 (as shown by arrow F in FIG. 1). Thereby, even in the case where the metal material is a metal, such as magnesium, which can be easily oxidized, unnecessary oxidation can be prevented by generating the nanoparticles 12 in the gas phase environment.

Next, a nanoparticle film-forming process is performed. In this process, the nanoparticles 12 are film-formed on the substrate 18 arranged in the nanoparticle film-forming region 15 of the laminating chamber 4, so that a nanoparticle film 21 is formed on the substrate 18. Specifically, the nanoparticles 12 generated in the nanoparticle generating process are guided into the nanoparticle film-forming region 15. When the inside of the laminating chamber 4 is vacuumed by the exhaust unit 5 in the nanostructure film-forming process described above, the pressure difference is also provided between the laminating chamber 4 and the nanoparticle generating chamber 2. Between both the chambers 4 and 2 connected to each other by the particle communication pipe 6, an air flow from the nanoparticle generating chamber 2 to the laminating chamber 4 is generated by the pressure difference (as shown by arrow C of FIG. 1). By this flow, the nanoparticles 12 are guided from the nanoparticle generating chamber 2 into the nanoparticle film-forming region 15 of the laminating chamber 4 through the particle communication pipe 6. Then, the nanoparticles 12 are film-formed on the substrate 18 arranged in the nanoparticle film-forming region 15. At this time, the nanofiber film 20 is already formed on the substrate 18 in the nanostructure film-forming process. For this reason, actually, the nanoparticle film 21 is laminated on the nanofiber film 20 formed on the substrate 18.

A returning process is performed simultaneously with the nanoparticle film-forming process. As described above, the substrate 18 is made to reciprocate between the nanofiber film-forming region 16 and the nanoparticle film-forming region 15 by the moving unit 17, and hence the substrate 18 arranged in the nanoparticle film-forming region 15 is moved into the nanofiber film-forming region 16. That is, the process, in which the substrate 18 is moved from the nanoparticle film-forming region 15 into the nanofiber film-forming region 16 (as shown by arrow D of FIG. 1), is the returning process. During this movement, the nanoparticles 12 are film-formed on the nanofibers 13 film-formed on the substrate 18, and hence the substrate 18, on which the nanofiber film 20 and the nanoparticle film 21 are formed, is moved.

Figure 2:
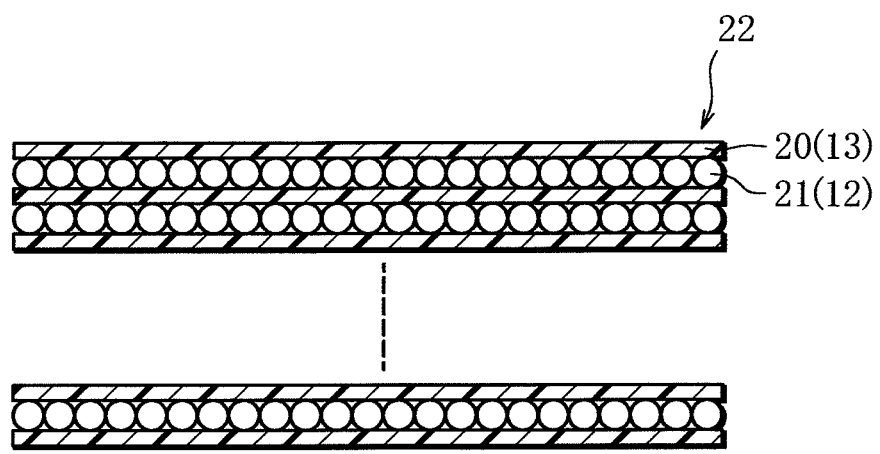
FIG. 2 is a schematic sectional view of a laminated body manufactured by using the particulate film laminating system according to the present invention.

Then, the nanofibers 13 are film-formed on the substrate 18 again moved into the nanofiber film-forming region 16. At this time, the nanofiber film 20 is laminated on the nanoparticle film 21. Then, the substrate 18 is again moved into the nanoparticle film-forming region 15, and the nanoparticle film 21 is formed. Therefore, when the substrate 18 is made to repeatedly reciprocate between the nanofiber film-forming region 16 and the nanoparticle film-forming region 15 by continuously rotating the rolls 19, the nanofiber film 20 and the nanoparticle film 21 are alternately laminated on the substrate 18 as shown in FIG. 2, so that a laminated body 22 is manufactured. When the laminated body 22 is used, for example, as a hydrogen sensor, the laminated body 22 is cut to a suitable length.

As described above, it is possible to perform a film-forming process in which the nanofibers 13 are film-formed on the substrate 18 in the nanofiber film-forming region 16, in which the substrate 18 is moved into the nanoparticle film-forming region 15 by the moving unit 17, and then the nanoparticles 12 are film-formed on the film-formed nanofiber 13, and in which the substrate 18 is again moved into the nanofiber film-forming region 16 by the moving unit 17, and then the nanofibers 13 are film-formed on the film-formed nanoparticles 12. By repeating this process, the film-formed nanoparticles 12 can be held between the film-formed nanofibers 13. In other words, with the present invention, it is possible to laminate a plurality of the nanoparticle films 21 by using the nanofiber films 20. Thereby, the nanoparticles 12 are film-formed so as to be arrayed in layers. Therefore, in the case where the nanoparticles 12 are generated from a hydrogen storage alloy, the diffusion property of hydrogen is improved by using the laminated body 22 as a hydrogen sensor. Further, in the laminated body 22 in which each of the nanoparticle films 21 is held between the nanofiber films 20, the nanoparticles 12 stably remain in the nanoparticle state, and hence the grain growth can be prevented.

Further, since the diameter of the particle communication pipe 6 is very small, a large pressure difference is generated between the laminating chamber 4 and the nanoparticle generating chamber 2, and hence a large flow rate is also generated. For this reason, the nanoparticles 12 are inhibited from colliding with each other during the movement thereof, and hence the occurrence of grain growth is also prevented during the movement.

Figure 3:
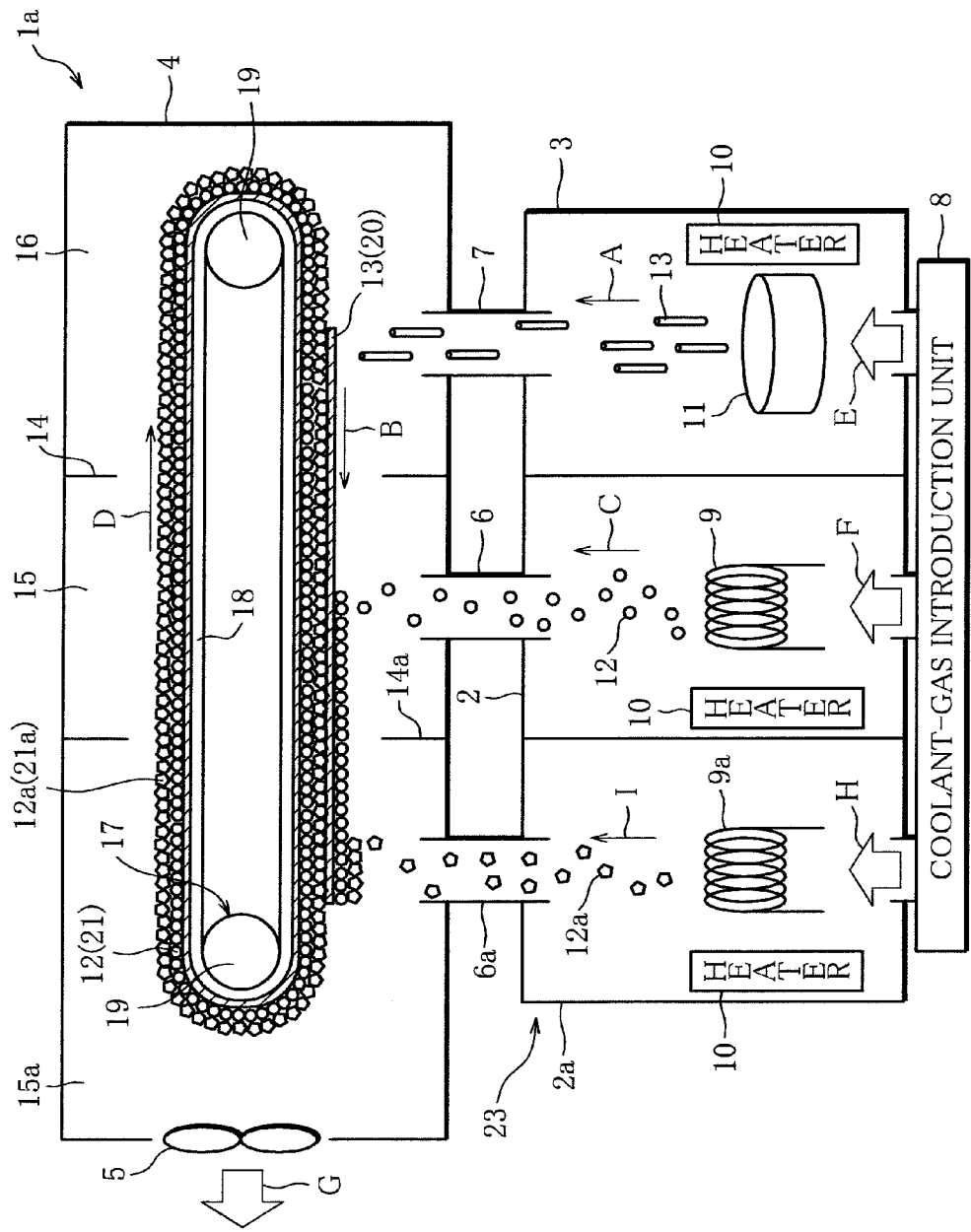
FIG. 3 is a schematic view of another particulate film laminating system according to the present invention.
Figure 4:
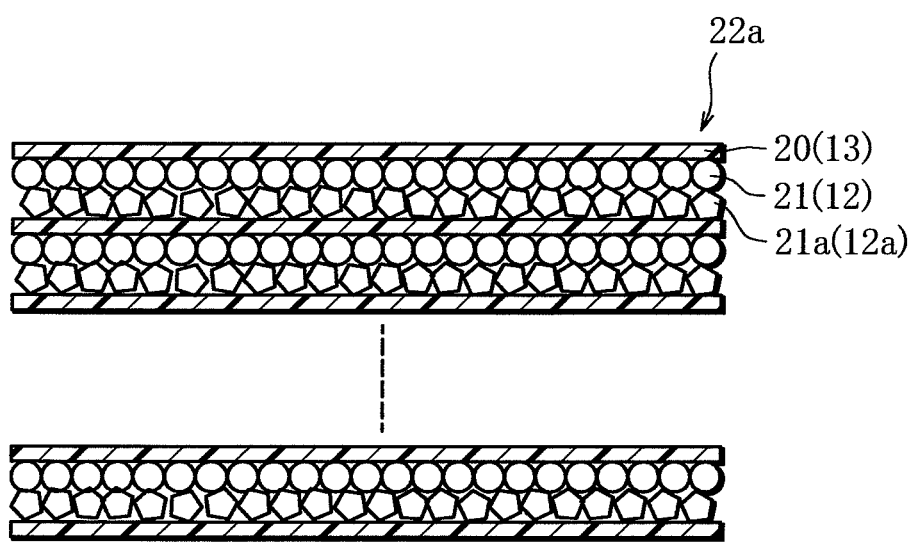
FIG. 4 is a schematic sectional view of a laminated body manufactured by using the particulate film laminating system of FIG. 3.

FIG. 3 shows another particulate film laminating system 1a according to the present invention. The system 1a is different from the above-described system 1 in that two-layers of the nanoparticles are formed on the nanofiber film 20. That is, a nanoparticle film-forming region 15a is further formed so as to be adjacent to the nanoparticle film-forming region 15, and these regions 15 and 15a are partitioned from each other by a partition wall 14a. In the nanoparticle film-forming region 15a, nanoparticles 12a different from the nanoparticles 12 are film-formed, so that a nanoparticle film 21a is formed. The manufacturing process of the nanoparticles 12a is the same as the above-described manufacturing process of the nanoparticle 12. Specifically, the nanoparticles 12a are generated by heating a metal wire 9a by the heater 10 in a nanoparticle generating chamber 2a while coolant gas is introduced from the coolant-gas introduction unit 8 into the nanoparticle generating chamber 2a (as shown by arrow H of FIG. 3). The generated nanoparticles 12a are moved (as shown by arrow I of FIG. 3), so as to flow into the nanoparticle film-forming region 15a in the laminating chamber 4 through a particle communication pipe 6a. With this structure, the nanoparticle films 21 and 21a are laminated on the nanofiber film 20 formed on the substrate 18, and these films can be further laminated on the substrate 18 by repeating this film-forming process. In a laminated body 22a obtained in this way, a layer, in which the nanoparticle film 21 and the nanoparticle film 21a are laminated on the nanofiber film 20, is repeatedly formed as shown in FIG. 4.

It should be noted that, in the case where another nanoparticle film is to be further laminated, it is only necessary that a nanoparticle film-forming unit 23 is formed by the nanoparticle generating chamber, the particle communication pipe, and the nanoparticle film-forming region, and that a plurality of the nanoparticle film-forming units 23 are provided. Further, although the present embodiment is described by using the nanofiber 13 as an example of the nanostructure formed of the resin material 11, the present embodiment may also be configured such that the nanoparticle of the resin material 11 is formed as a nanostructure, such that a porous film is formed by the nanoparticles, and such that the nanoparticle film 21 is formed on the porous film. That is, the portion described as the nanofibers in the above can be replaced by nanoparticles (nanostructures) generated from a resin material.

EXPLANATION OF REFERENCE SIGNS 1, 1a Particulate film laminating system
2, 2a Nanoparticle generating chamber
3 Nanofiber generating chamber (Nanostructure generating chamber)
4 Laminating chamber
5 Exhaust unit
6, 6a Particle communication pipe
7 Fiber communication pipe (structure body communication pipe)
8 Coolant-gas introduction unit
9, 9a Metal material
10 Heater
11 Resin material
12, 12a Nanoparticle
13 Nanofiber (Nanostructure)
14, 14a Partition wall
15, 15a Nanoparticle film-forming region
16 Nanofiber film-forming region (nanostructure film-forming region)
17 Moving unit
18 Substrate
19 Roll
20 Nanofiber film (nanostructure Film)
21, 21a Nanoparticle film
22, 22a Laminated body
23 Nanoparticle film-forming unit

The invention claimed is:

1. A particulate film laminating system comprising:
a nanoparticle generating chamber in which a metal material to be heated is arranged and nanoparticles of the metal material are generated;
a nanostructure generating chamber in which a resin material to be heated is arranged and nanostructures of the resin material are generated;
a laminating chamber which is connected to the nanoparticle generating chamber and the nanostructure generating chamber respectively via a particle communication pipe and a structure body communication pipe, so as to enable the nanoparticles and the nanostructures to be film-formed and laminated on a substrate, wherein the nanoparticle generating chamber and the nanostructure generating chamber are wholly positioned outside of the laminating chamber;
a nanoparticle film-forming region configured such that the nanoparticles are film-formed in the laminating chamber;
a nanostructure film-forming region configured such that the nanostructures are film-formed in the laminating chamber;
a moving unit which moves the substrate between the nanoparticle film-forming region and the nanostructure film-forming region;
an exhaust unit which exhausts the laminating chamber; and
a coolant-gas introduction unit which introduces coolant gas into each of the nanoparticle generating chamber and the nanostructure generating chamber,
wherein a first section of the particle communication pipe is directly connected to a first end portion of the nanoparticle generating chamber, and a second section of the particle communication pipe is directly connected to a first end portion of the laminating chamber,
wherein a diameter and a length of the particle communication pipe are adjusted to be within a range in which grain growth of the nanoparticles can be prevented, and
wherein the particle communication pipe extends only between the first end portion of the nanoparticle generating chamber and the first end portion of the laminating chamber.

2. The particulate film laminating system according to claim 1, wherein a nanoparticle film-forming unit is formed by the nanoparticle generating chamber, the particle communication pipe, and the nanoparticle film-forming region, and a plurality of the nanoparticle film-forming units are provided.

3. The particulate film laminating system according to claim 2, wherein the moving unit is formed by a pair of rolls each arranged in each of the nanoparticle film-forming region and the nanostructure film-forming region, and the substrate is endless and is wound around the pair of rolls.

4. The particulate film laminating system according to claim 1, wherein the exhaust unit exhausts the laminating chamber such that a pressure difference created between the nanoparticle generating chamber and the laminating chamber when the nanoparticles move through the particle communication pipe becomes equal to a pressure difference at which grain growth of the nanoparticles of the metal material is prevented.

5. A particulate film laminating method using the particulate film laminating system according to claim 1, the method comprising:
a nanostructure generating process of generating the nanostructures by heating and evaporating the resin material in the nanostructure generating chamber;
a nanostructure film-forming process in which a first pressure difference is provided between the laminating chamber and the nanostructure generating chamber by exhausting the laminating chamber by the exhaust unit, and the nanostructures are introduced into the nanostructure film-forming region by the first pressure difference through the structure body communication pipe, and a nanostructure film is formed by film-forming the nanostructures on the substrate arranged in the nanostructure film-forming region;
a going process of moving the substrate with the nanostructures film-formed thereon into the nanoparticle film-forming region by the moving unit;
a nanoparticle generating process of generating the nanoparticles by heating and evaporating the metal material in the nanoparticle generating chamber;

a nanoparticle film-forming process in which a second pressure difference is provided between the laminating chamber and the nanoparticle generating chamber by exhausting the laminating chamber by the exhaust unit, and the nanoparticles are introduced into the nanoparticle film-forming region by the second pressure difference through the particle communication pipe, and a nanoparticle film is formed by film-forming the nanoparticles on the nanostructures film-formed on the substrate arranged in the nanoparticle film-forming region; and a returning process of moving the substrate with the nanoparticle film and the nanostructure film formed thereon into the nanostructure film-forming region by the moving unit.

* * * * *